US012693312B2

(12) United States Patent
Lo et al.

(10) Patent No.: US 12,693,312 B2
(45) Date of Patent: Jul. 28, 2026

(54) QUICK COUPLING PROBE HEAD

(71) Applicant: MPI Corporation, Zhubei City (TW)

(72) Inventors: Ya-Hung Lo, Zhubei City (TW);
Chien-Hsun Chen, Zhubei City (TW);
Chia-Nan Chou, Zhubei City (TW);
Shou-Jen Tsai, Zhubei City (TW);
Fuh-Chyun Tang, Zhubei City (TW)

(73) Assignee: MPI Corporation, Zhubei City (TW)

( * ) Notice: Subject to any disclaimer, the term of this patent is extended or adjusted under 35 U.S.C. 154(b) by 147 days.

(21) Appl. No.: 18/672,112

(22) Filed: May 23, 2024

(65) Prior Publication Data

US 2025/0044322 A1 Feb. 6, 2025

Related U.S. Application Data

(60) Provisional application No. 63/468,542, filed on May 24, 2023.

(51) Int. Cl.
G01R 1/067 (2006.01)
(52) U.S. Cl.
CPC ..... G01R 1/06772 (2013.01); G01R 1/06794 (2013.01)
(58) Field of Classification Search
CPC .............. G01R 1/06772; G01R 1/073; G01R 31/2886; G01R 31/2889; G01R 1/06727; G01R 1/07314; G01R 1/0416; G01R 1/07357; G01R 31/2851; G01R 1/0408; G01R 23/02; G01R 31/01; G01R 1/067; G01R 1/07342; G01R 1/06711; H01R 24/50; H01R 12/7082; H01R 24/40; H01R 13/6587; H01R 12/716; H01R 13/02; H01R 9/05; H01R 13/6581; H01R 13/635; H01R 12/75; H05K 1/0243; H05K 2201/09809
See application file for complete search history.

(56) References Cited

U.S. PATENT DOCUMENTS

| | | | | |
|---|---|---|---|---|
| 4,783,625 A | * | 11/1988 | Harry | G01R 1/06772 |
| | | | | 324/754.07 |
| 6,232,769 B1 | * | 5/2001 | Brunsch | G01D 5/485 |
| | | | | 324/207.13 |

(Continued)

FOREIGN PATENT DOCUMENTS

| | | |
|---|---|---|
| TW | 576506 U | 2/2004 |
| TW | 202311752 A | 3/2023 |

*Primary Examiner* — Vinh P Nguyen
(74) *Attorney, Agent, or Firm* — Troutman Pepper Locke LLP; Tim Tingkang Xia, Esq.

(57) ABSTRACT

The present invention provides a quick coupling probe card, utilized to test circuit board. The quick coupling probe card comprises a base, a coaxial connector, mechanical connector, and probe holding part, wherein the base has a first surface and a second surface corresponding to the first surface, the coaxial connector arranged on the base has one end above the first surface, and is coupled to the test machine for transmitting the high frequency signal, the mechanical connector is arranged on the first surface for coupling to the test machine, and is closer to a center of the base than the coaxial connector, and the probe holding part, arranged on the second surface and utilized to couple to the coaxial connector, has one end connected to a high frequency probe corresponding to one specific kind of the different kinds of pitches.

13 Claims, 10 Drawing Sheets

(56) References Cited

U.S. PATENT DOCUMENTS

| | | | |
|---|---|---|---|
| 6,310,483 B1 * | 10/2001 | Taura ................. | G01R 1/06772 |
| | | | 324/755.02 |
| 7,449,899 B2 * | 11/2008 | Campbell .......... | G01R 1/06772 |
| | | | 324/755.02 |

* cited by examiner

QUICK COUPLING PROBE HEAD

This application claims the benefit of U.S. Provisional Patent Application Ser. 63/468,542, filed May 24, 2023, the subject matter of which is incorporated herein by reference.

BACKGROUND OF INVENTION

1. Field of the Invention

The present invention relates to a probe head, specifically to a quick coupling probe head capable of performing high-frequency electrical tests and being used for rapid replacement on a test machine.

2. Description of the Prior Art

Due to the miniaturization of electronic components, it is necessary to test device under test (DUT) after the semi-conductor process so as to determine whether there are any issues in signal transmission, thereby ensuring the quality of electronic components. Generally, when it comes to test whether the electrical connections between various electronic components in electronic products are reliable, or if there are any issues with signal transmission, devices equipped with probes are typically used for analyzing signal transmission and electrical signal of the DUT.

Conventional inspection equipment comprises a probe device and a test machine for conducting electrical tests on the DUT. Generally, the same DUT, such as a package substrate or a printed circuit board (PCB), will have issues that contact points have different pitches. Different pitches between contact points require probe heads with corresponding probe pitches to test the DUT. Therefore, it is necessary to develop probe heads that can be automatically switched, and each probe head comprises probe needles having different pitches between needle tips.

Accordingly, there is a need for a quick coupling probe head to address the aforementioned issues.

SUMMARY OF THE INVENTION

Due to the need for high-frequency signal testing in electrical contacts, the present invention employs coaxial connectors to meet the requirements of high-frequency electrical testing. In one embodiment, the present invention provides a quick coupling probe head suitable for testing DUTs, such as circuit boards including substrates or printed circuit boards (PCBs), with high-frequency signal contact points having different pitches therebetween. Since it is necessary to change probe head when testing high-frequency signal contact points with different pitches, and there are mechanical and electrical contact issues should be overcome when coupling the probe head with the machine platform, the present invention addresses these issues by simultaneously equipping the mechanical connectors and coaxial connectors for high-frequency signal transmission on the base. This allows the probe head to be mechanically secured and quickly connected to the test machine. Additionally, since the test machine drives the probe head to perform three-dimensional translation and rotational movements, it is also an important issue that how to prevent the stability of high-frequency test signals from being affected due to the entanglement between the transmission cables between probe needles and the electrical connectors of the probe head during the movement of probe head.

To address the aforementioned issues, in one embodiment, the present invention provides a quick coupling probe head for testing circuit boards. The quick coupling probe head comprises a base, a coaxial connector, a mechanical connector, and a probe holding part. The base comprises a first surface and a second surface corresponding to the first surface. The coaxial connector, coupled to the base, comprises one end higher than the first surface. The coaxial connector is used to couple with a probe head connection part of a test machine to transmit high-frequency signals. The mechanical connector is arranged on the first surface to connect with the test machine, and the mechanical connector is closer to the center of the base compared to the coaxial connector. The probe holding part is connected to the second surface, and one end of the probe holding part is utilized to connect to a high-frequency probe electrically connected to the coaxial connector. In this embodiment, with the mechanical connector and the coaxial connector arranged on the first surface of the base, it allows the probe head to be mechanically fixed to the test machine while maintaining the flatness of the coaxial connector thereby stably transmitting high-frequency test signals. Additionally, since the test machine drives the quick coupling probe head to perform movement, such as XYZ movement, horizontal translation, and rotation, which cause the issues that the transmission cable between the coaxial connector entangled with the probes due to the previously described movements; therefore, in this embodiment, the mechanical connector is arranged to be closer to the center of the base than the coaxial connector thereby preventing the transmission cable from being entangled during the movements of probe head so as to achieve effect of stably transmitting high-frequency signal.

Additionally, when replacing probe heads with different pitches between probe tips, the probe holder on the test machine will grab the probe head having appropriate tip pitch. During this grabbing process, the situation associated with the mechanical coupling and electrical contact will be occurred. In such use cases, particularly in case of high-frequency testing, the stability of signal transmission is crucial. Therefore, how to ensure stability of the connection between the probe head and the connecting part of probe head for resulting in mechanically fixed effect as well as keeping electrical contact at the same time, i.e. ensuring the flatness of the electrical connectors on the probe head and the connection part of the probe head thereby maintaining effective electrical contact for high-frequency signal transmission is an important issue should be concerned. Therefore, in one embodiment, the height of the mechanical connector is greater than the height of the coaxial connector. Since the mechanical connector is higher than the coaxial connector, this design allows the mechanical connector to firstly connect with the test machine thereby correcting the position so that the position and level of the coaxial connector can reach the predetermined conditions. Additionally, during the connection process, the concentricity of the probe head is adjusted such that the coaxial connector can reach the desired flatness during alignment whereby the coaxial connector could be stably connected with the test machine thereby maintaining stable electrical signal transmission between the coaxial connector and the test machine.

Since the probe head of the present invention comprises both a mechanical connector and a coaxial connector, if either or both connectors have bending angle, it could induce the interference between connectors during quick connection thereby affecting electrical resolution or causing damage due to contact. Therefore, in this embodiment, the first surface is located on the first axis and second axis perpendicular to the first axis. The mechanical connector and the coaxial connector extend a specific height along a third axis perpendicular to both the first and second axes, respectively. Both the mechanical connector and the coaxial connector have openings, and an alignment mechanism is further arranged on the first surface, wherein the distance between the alignment mechanism and the mechanical connector is shorter than the distance between the alignment mechanism and the coaxial connector. Although both mechanical connector and coaxial connector can improve alignment accuracy, slight offset may still be occurred to affect the stability of high-frequency signal transmission. Therefore, in one embodiment, an alignment mechanism is arranged on the first surface. Through adding an alignment mechanism, the position offset can be reduced, thereby enhancing the electrical stability of high-frequency test signals.

In one embodiment, the first surface also comprises a pressure sensor connector, and the probe holding part further comprises a cantilever and a pressure sensor. The cantilever is coupled to the base and comprises a connecting end and a free end. The connecting end is coupled to the base, and the free end is utilized to couple to the high-frequency probe. The pressure sensor is mounted on the surface of the cantilever and is electrically connected to the pressure sensor connector.

On the other hand, if the signal cable between the high-frequency probe and the signal connector on the probe head is too long, it is detrimental to the transmission of high-frequency test signals. Therefore, how to reduce the length of signal cable for minimizing the signal loss is also a design issue that needs to be overcome. Therefore, in one embodiment, the first surface is located on a first axis and second axis perpendicular to the first axis. The first and second axes are perpendicular to a third axis, and the base has a first side along the first axis. At the direction along the third axis toward the quick coupling probe head, the coaxial connector is located between the mechanical connector and the free end, and is coupled to the first side of the base. The cantilever extends from the connecting end to the free end along the first axis and protrudes in the direction away from the first side of the base so as to prevent the probe from being covered by the coaxial connector and the base at the direction along the third axis toward the quick coupling probe head. In addition to the previously described embodiment, in another embodiment, the first surface is located on a first axis and second axis perpendicular to the first axis. The first and second axes are perpendicular to a third axis, and the base has a first side along the first axis. At the direction along the third axis toward the quick coupling probe head, the first side of the base is arranged between the mechanical connector and the free end while the coaxial connector is arranged on an extension plate arranged on the first side of the base. The cantilever extends from the connecting end to the free end along the first axis. The extension plate has a first side along the first axis, and the coaxial connector is located between the first side of the base and the first side of the extension plate. The first side of the extension plate and the free end are separated by a specific distance along the first axis. Through the design of previously described embodiments, the distance between the high-frequency probe and the coaxial connector can be shortened by arranging the cantilever and the coaxial connector at the same side so that the length of the signal cable can be reduced, thereby achieving the effect of minimizing signal loss. Additionally, with this distance design, at the direction along the third axis toward the quick coupling probe head, the free end of the cantilever can not be covered by the coaxial connector and the base such that the image capture device of the visual recognition system on the test machine can capture images of the high-frequency probe without obstruction, thereby achieving the effect of accurately recognizing the needle tip of the high-frequency probe.

In addition, conventional signal cables are typically rigid so that how to minimize cable bending so as to prevent breakage should be overcome through design, and the arranged position of the signal cable connector should be noticed so as to avoid signal cables exerting preload on cantilever thereby affecting the measurement accuracy of pressure sensors. Therefore, in one embodiment, a first surface is located on a first axis and a second axis perpendicular to the first axis, and the first and second axes are perpendicular to a third axis. The base comprises a first side along the first axis. At the direction along the third axis toward the quick coupling probe head, the coaxial connector is arranged between the mechanical connector and the free end. The central axis of the mechanical connector and the central axis along the longitudinal axis of the cantilever forms a virtual plane perpendicular to the first surface and passing through the cantilever. The virtual plane divides the first side of the base into first and second segments wherein the coaxial connector is coupled to the first segment of the first side of the base and the central axis along the axial direction of the coaxial connector has a specific distance away from the virtual plane along the second axis. Through the previously described embodiment that there is an offset between the coaxial connector and mechanical connector, the bending of the signal cable can be reduced to prevent the signal cable from being breakage whereby the stability of signal transmission can be kept. In addition, due to the rigidity of the signal cables, if the position of coaxial connector is improper, the preload that the signal cable exerting on the cantilever will be easily caused so as to affect the measurement accuracy of pressure sensors. Therefore, through the previously described misalignment design, the issues affecting accuracy of pressure sensor measurements on the cantilever can be avoided.

In one embodiment, the pressure sensor connector is arranged on the second segment of the base. Due to the inherent rigidity of the signal cable, excessive bending should be avoided. Therefore, through the offset design between the coaxial connector and mechanical connector described previously, cable bending can be minimized so as to prevent breakage, thereby maintaining stable signal transmission. Additionally, improper position of the coaxial connector can induce the signal cable exerting preload on the cantilever due to the rigidity of signal cable, thereby affecting the measurement accuracy of the pressure sensor. Accordingly, through the previously described offset design, impact on the sensing accuracy of the pressure sensor arranged on the cantilever can be prevented.

In one embodiment, a first surface is positioned along first and second axes that are mutually perpendicular to each other and are perpendicular to a third axis. The base has a first side along the first axis. At the direction along the first axis toward the quick coupling probe head, the central axis of the mechanical connector along the axial direction and the central axis of the cantilever along the longitudinal axial direction form a virtual plane perpendicular to the first surface and passing through the cantilever so as to divide the first side of the base into first and second segments. The coaxial connector further comprises a first coaxial connector and a second coaxial connector coupled to the first segment and second segment of the first side of the base, respectively.

Due to the inherent rigidity of the signal cable, excessive bending should be avoided. Therefore, through the offset design between the coaxial connector and mechanical connector described previously, cable bending can be minimized to prevent breakage, thereby maintaining stable signal transmission. Additionally, since improper position of the coaxial connector can induce the signal cable exerting preload on the cantilever due to the rigidity of signal cable, thereby affecting the measurement accuracy of the pressure sensor, through the previously described misalignment design, impact on the sensing accuracy of the pressure sensor arranged on the cantilever can be prevented. Moreover, in some application conditions, using two coaxial connectors can generate differential measuring signals, which can avoid the signal interference and enhance accuracy of the measuring signal.

In one embodiment, a spacer block with a first end face and a second end face is further provided. The first end face of the spacer block connects to the second surface of the base, and the second end face connects to the connecting end of the cantilever. Due to the inherent rigidity of the signal cable, excessive bending should be avoided. Therefore, through the design of the spacer block as described above, the accommodation area for accommodating the signal cable can be increased so as to prevent the cable from being bent.

In one embodiment, the coaxial connector and the pressure sensor connector are connected on the same side of the base. In one embodiment, the coaxial connector is a plug connector.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1A:
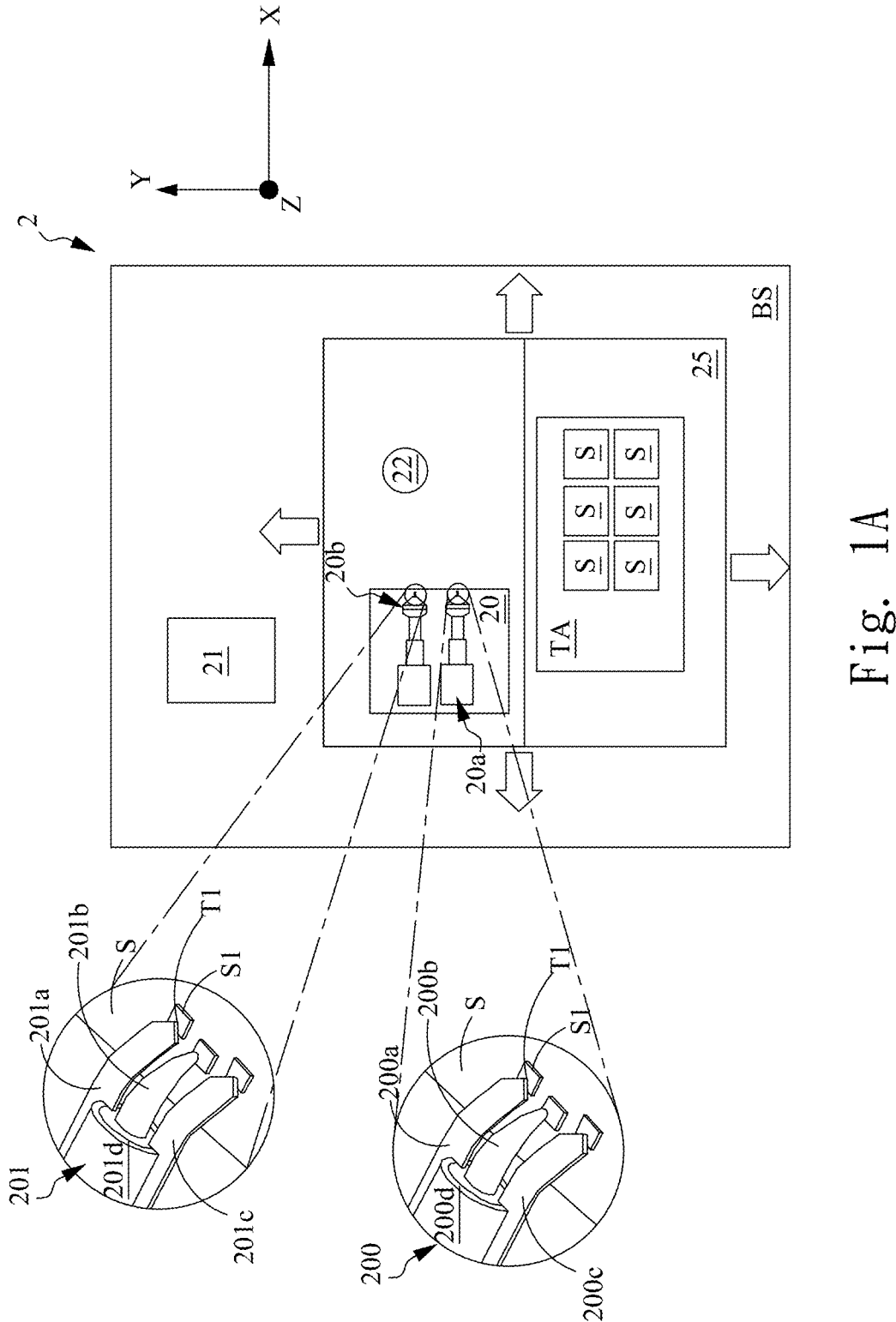
FIG. 1A schematically illustrates an embodiment of a test machine and the quick coupling probe head of the present invention arranged on the test machine.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure. In addition, the terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 1B:
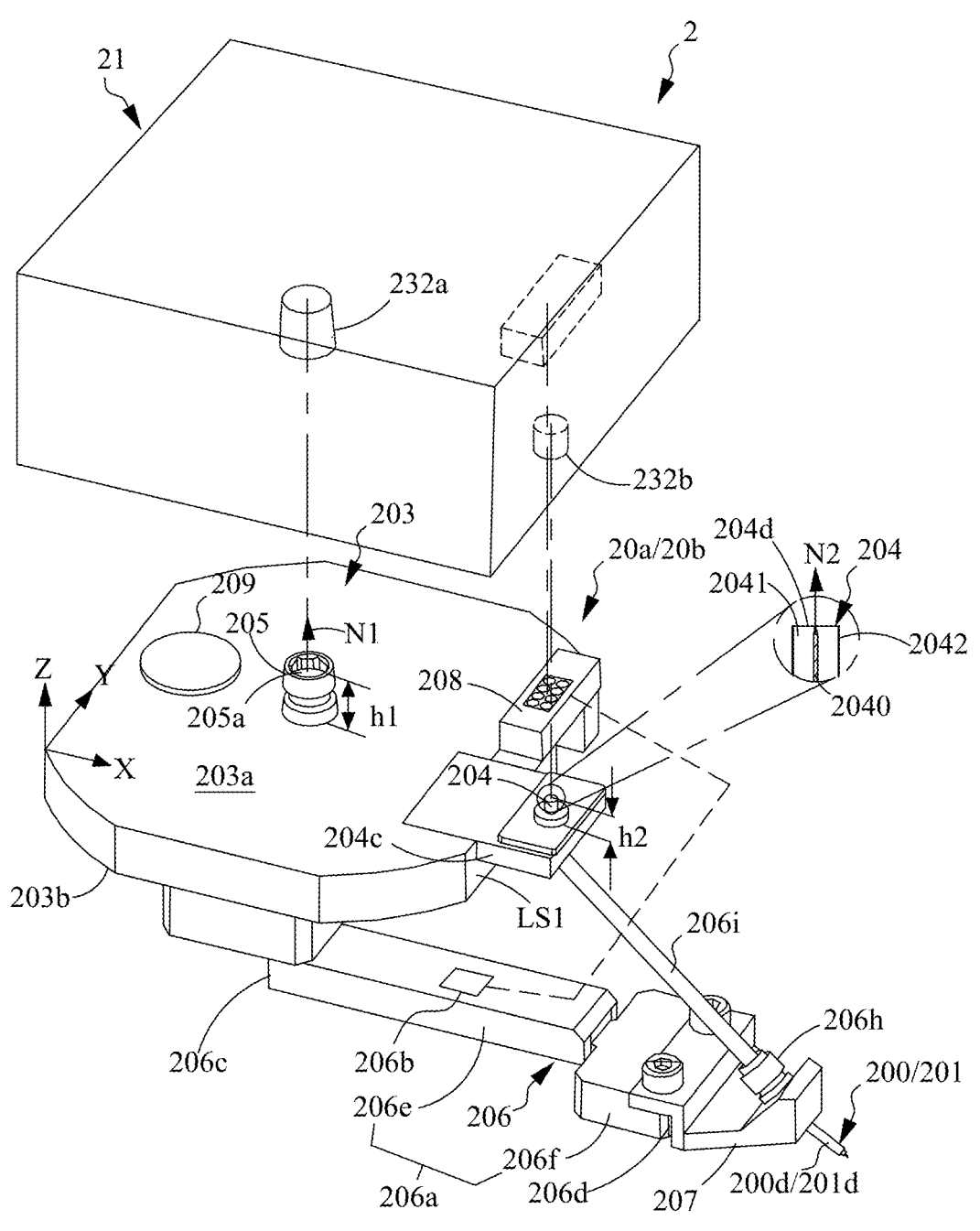
FIG. 1B schematically illustrates the probe holder gripping the quick coupling probe head of the present invention.
Figure 1C:
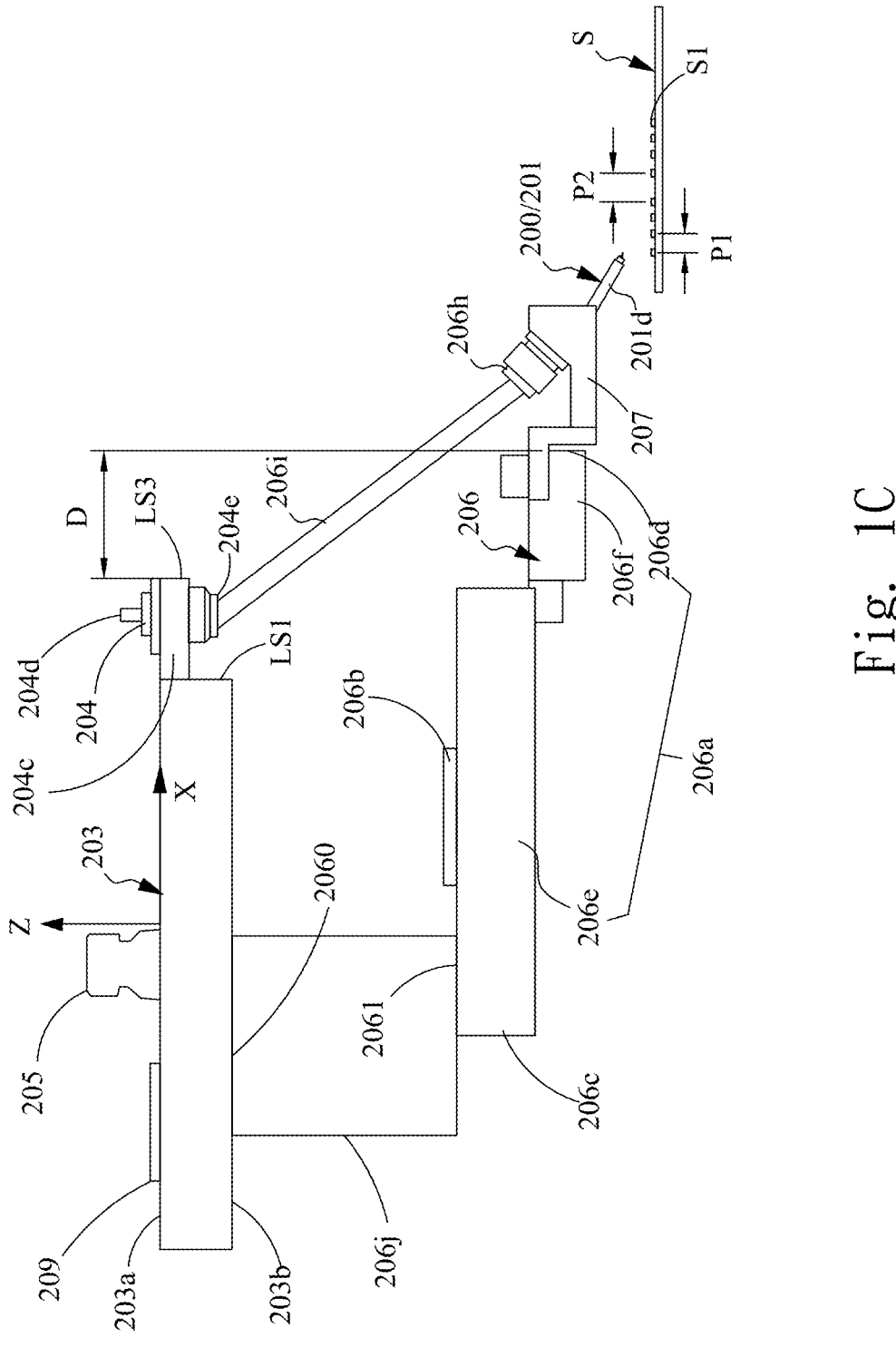
FIG. 1C is a side view of the quick coupling probe head.

Please refer to FIGS. 1A to 1C, wherein FIG. 1A schematically illustrates an embodiment of a test machine and the quick coupling probe head of the present invention arranged on the test machine; FIG. 1B schematically illustrates the probe holder gripping the quick coupling probe head of the present invention; and FIG. 1C is a side view of the quick coupling probe head. The test machine 2 comprises a base BS, on which a probe head placement section 20, a probe head connection part 21, a visual recognition module 22, and a platform 25 are arranged. The probe head placement section 20 are provided to allow a plurality of quick coupling probe heads 20a and 20b arranged thereon, wherein the plurality of quick coupling probe heads are utilized for performing electrical testing on the DUTs having contact points with different pitches. The quick coupling probe head 20a and 20b are arranged on the test machine 2. The quick coupling probe head 20a or 20b are utilized to mechanical and electrically connect with the probe head connection part 21. Furthermore, since the pitch between adjacent contact points S1 on the DUT S may be the same or different, replacement of the quick coupling probe head 20a or 20b corresponding to the pitch is required such that the probes on the quick coupling probe head 20a or 20b can contact with the corresponding contact points. In one embodiment, the DUT S is a circuit board, which comprises a package substrate or a printed circuit board, but it is not limited thereto. The DUT S has contact points S1, and as previously mentioned, the adjacent contact points S1 may have different pitches P1 and P2 as shown in FIG. 1C. A plurality of quick coupling probe heads 20a and 20b are arranged within the area of the probe holder placement section 20. The structures of the probe heads 20a and 20b are basically the same, in which the different part is that the pitch between probe needle is different from each other, i.e., the pitch of the probe needle of probe head 20a being different from that of probe head 20b. Probe head 20a has a first probe needle 200, which comprises a plurality of the first needle bodies 200a to 200c. The needle tips T1 between adjacent first needle bodies 200a and 200b, 200b and 200c have a first pitch, which is utilized to electrically contact the corresponding electrical contact points S1 on the DUT S with the first pitch. The back of each first needle bodies 200a to 200c is connected to an impedance matching structure 200d, such as a coaxial copper tube or an impedance-matched printed circuit board. In this embodiment, the impedance matching structure 200d is a coaxial copper tube so that the first probe 200 is formed as an impedance-matched probe. The first probe needle 200 in this embodiment is a high-frequency or radio-frequency (RF) probe. Likewise, the second Probe head 20b also has a second probe needle 201. The second probe needle 201 comprises a plurality of second needle bodies 201a to 201c. The needle tips T2 of adjacent second needle bodies 201a and 201b, 201b and 201c have a second pitch having different dimension from the first pitch of the first probe head 20a. The back of each second needle bodies 201a to 201c are connected to an impedance matching structure 201d, such as a coaxial copper tube or an impedance-matched printed circuit board. In this embodiment, the impedance matching structure 201d is a coaxial copper tube so that the second probe 201 is formed as an impedance-matched probe, as shown in FIG. 1A, it can be a high-frequency or radio-frequency (RF) probe.

In one embodiment, the first needle bodies 200a to 200c and the second needle bodies 201a to 201c are probe structures made of metal material. Additionally, it is noted that the number of the first or second needle bodies is at least two, i.e., two or more, and is not limited to the quantity shown in FIG. 1A. As shown in FIG. 1A, in this embodiment, the first probe needle 200 and the second probe needle 201 have three detection needle bodies, respectively, representing a GSG structure, where G stands for ground and S stands for signal. Furthermore, if the first probe 200 described in the present invention has two or more first needle bodies 200a to 200c, as shown in FIG. 1A, the manufacturing tolerances of the first pitch between the needle tips T1 of the first needle bodies 200a and 200b, and the first pitch between the needle tips T1 of the first needle bodies 200b and 200c could exist. However, as long as the first pitch can meet the pitch requirements of the contact points on the DUT, it will belong to the range of the first pitch. Likewise, if the second probe 201 described in the present invention has two or more second needle bodies 201a to 201c, as shown in FIG. 1A, the manufacturing tolerances of the second pitch between the needle tips T1 of the first needle bodies 201a and 201b, and the second pitch between the needle tips T1 of the second needle bodies 201b and 201c could exist. However, as long as the second pitch can meet the pitch requirements of the contact points on the DUT, it will belong to the range of the second pitch.

In FIG. 1A, a virtual coordinate system XYZ is established according the stationary base BS, where the XY axes are established according to a two-dimensional plane that the platformed 25 is moved, and the Z axis represents the vertical axis of height elevation. The platform 25 is used to support at least one DUT S, which, in the present embodiment, is a circuit board with contact points having different pitches. Furthermore, in this embodiment, the platform 25 can perform two-dimensional linear displacement along the X and Y axes. In this embodiment, the probe head placement section 20 and the visual recognition module 22 are mounted on the platform 25. The platform 25 comprises a testing area TA on which the DUT is arranged. It is noted that the position where the visual recognition module 22 is arranged can be determined according to the utilization rate and workflow requirements, and is not limited to the illustrated embodiment.

As shown in FIGS. 1B and 1C, the probe head 20a or 20b comprises a base 203, a coaxial connector 204, a mechanical connector 205, and a probe holding part 206. The base 203 has a first surface 203a and a corresponding second surface 203b. In this embodiment, the first surface 203a is located on first axis X and second axis Y that are mutually perpendicular to each other. The mechanical connector 205 and the coaxial connector 204 extend to a specific height along the third axis Z perpendicular to the first axis X and the second axis Y, respectively. The coaxial connector 204 is coupled to the base 203 wherein one end of the coaxial connector 204 is higher than the first surface 203a. The coaxial connector 204 is utilized to connect to the probe head connection part 21 of the test machine 2 for transmitting high-frequency signals. When the view angle is from the first axis X to the YZ plane formed by the second axis Y and the third axis Z, one end of the coaxial connector 204 is higher than the first surface 203a. In this embodiment, on the first side LS1 of the base 203 is further connected to an extension plate 204c on which the coaxial connector 204 is arranged. The first end 204d of the coaxial connector 204 is higher than the first surface 203a, and the second end 204e of the coaxial connector 204 penetrates through the extension plate 204c and is connected to the signal cable 206i. In other embodiments, the coaxial connector 204 can be directly arranged near the first side LS1 of the base 203 and the first end 204d of the coaxial connector 204 is higher than the first surface 203a. The coaxial connector 204 penetrates through the base 203, such that the second end 204e of the coaxial connector 204 is connected with the signal cable 206i. The mechanical connector 205 is arranged on the first surface 203a to connect with the test machine, wherein the mechanical connector 205 is closer to the center of the base 203 compared to the coaxial connector 204. The probe holding part 206 is connected to the second surface 203b. One end of the probe holding part 206 is utilized to connect to the probe connecting seat 207. The probe connecting seat 207 comprises the high-frequency probe comprising the first probe 200 or the second probe 201. The probe connecting seat 201 further comprises a signal transmission interface 206h electrically connected to the coaxial connector 204 via the signal cable 206i. The signal transmission interface 206h, for example, can be a coaxial connector. The signal cable 206i, for example, can be a coaxial cable.

It should be noted that, in order to explain conveniently, the three axes defined on the probe heads 20a or 20b are a virtual coordinate system XYZ established based on the base BS, for example. However, if there is no base BS as a reference, a virtual coordinate system XYZ can also be established by using the first surface 203a as a reference, for example.

In this embodiment, the base 203 is connected to the probe head connection part 21 of the test machine 2. In this embodiment, one surface of the probe head connection part 21 corresponding to the first surface 203a further comprises a mechanical quick coupler 232a corresponding to the mechanical connector 205, and a coaxial quick coupler 232b corresponding to the coaxial connector 204. The mechanical connector 205, for example, is a mechanical quick connector. The mechanical connector 205 and the mechanical quick coupler 232a are complementary male and female connectors, respectively. When the probe head 20a or 20b is combined with the probe head connection part 21, the mechanical connector 205 is coupled with the mechanical quick coupler 232a, and the coaxial connector 204 is coupled with the coaxial quick coupler 232b. In one embodiment, the coaxial connector 204 is a plug connector that can be directly inserted and removed. In one embodiment, the coaxial connector 204 comprises mutually insulated inner conductor 2040 and outer conductor 2042. In another embodiment, the coaxial connector 204 can also be made of magnetic material such that the coaxial connector 204 and the corresponding coaxial quick coupler 232b on the test machine 2 side can be electrically connected through magnetic force. The coaxial connector 204 and the coaxial quick coupler 232b are complementary male and female connectors, respectively.

In the present embodiment, when the view angle is from the first axis X to the YZ plane formed by the second axis Y and the third axis Z, the mechanical connector 205 extends a specific height h1 along the third axis Z. The first end 204d (signal interface) of the coaxial connector 204 extends a specific height h2 along the third axis Z. An opening 205a is formed on the end face of the mechanical connector 205 at the extended height, and an opening 2041 is formed on the first end 204d of the coaxial connector 204 at the extended height. The normal vector N1 of the opening 205a and the normal vector N2 of the opening 2041 are parallel to the third axis Z. It should be noted that, in this embodiment, if one or both of the connectors i.e., mechanical connector 205 and coaxial connector 204, have a bending angle, it would cause interference of connectors when quick coupling thereby affecting electrical resolution or cause damage due to contact. Therefore, in the present embodiment, both connectors extend vertically upward from the first surface 203a and have openings formed thereon as interfaces for solving previously described problem. Although both the mechanical connector 205 and the coaxial connector 204 in this embodiment can improve alignment accuracy, there might still be slight position bias that could affect the stability of high-frequency signal transmission. Therefore, in one embodiment, an alignment mechanism 209 is additionally provided on the first surface 203a through which the position bias when connecting the base 203 with the probe head connection part 21 can be reduced, thereby increasing the electrical stability of high-frequency signal transmission. Furthermore, the distance between the alignment mechanism 209 and the mechanical connector 205 is less than the distance between the alignment mechanism 209 and the coaxial connector 204. The mechanical connector 205 and the alignment mechanism 209 can be utilized first to be an alignment during the connection between the base 203 and the probe head connection part 21. Once alignment is completed, it indicates that the coaxial connector 204 has been also aligned whereby the position bias of the coaxial connector 204 can be prevented and the electrical stability of high-frequency test signal transmission can be enhanced.

When replacing probe heads with different pitches of needle tip, the probe head connection part 21 on the test machine will grip the probe head with the suitable pitch between needle tip, such as probe head 20a or 20b shown in the illustrated figure such that mechanical connection and electrical contact will be occurred during gripping. In such gripping condition, especially in high-frequency testing applications, the stability of the test signal transmission is crucial. Therefore, how to ensure stable coupling between the probe head connection part and the probe head thereby achieving a mechanical fixation effect, and simultaneously to ensure the flatness between electrical connector on the probe head and the electrical connector of the probe head connection part when electrical contact so as to keep effective transmission of high-frequency test signals, are the important issues. Therefore, in this embodiment, the height h1 of the mechanical connector 205 is greater than the height h2 of the coaxial connector 204. Due to the greater height of the mechanical connector 205 compared to the coaxial connector 204, through the previously described design, the mechanical connector 205 will first connect with the probe holder connection part 21 of the test machine 2, for correcting the position. This adjustment allows the position and level of the coaxial connector 204 to reach the predetermined values. Simultaneously, by adjusting the concentricity of the probe holders 20a/20b during connection, the coaxial connector 204 can achieve the expected flatness such that the coaxial connector 204 can stably connected to the test machine 2, thereby maintaining the stability of the electrical signal transmission between the coaxial connector 204 and the test machine 2. Furthermore, the distance between the alignment mechanism 209 and the mechanical connector 205 is less than the distance between the alignment mechanism 209 and the coaxial connector 204. By using the mechanical connector 205 and the alignment mechanism 209 for aligning the connection between the base 203 and the probe head connection part 21, and adjusting the concentricity of the probe heads 20a/20b at the same time, the expected position and flatness of the coaxial connector 204 can be adjusted for enabling the base 203 to be connected to the probe head connection part 21.

In the present embodiment, the first surface 203a of the probe heads 20a/20b further comprises a pressure sensor connector 208. The probe holding part 206 further comprises a cantilever 206a and a pressure sensor 206b. The cantilever 206a is coupled to the base 203 and has a connection end 206c and a free end 206d, wherein the connection end 206c is coupled to the base 203. The cantilever 206a further comprises a first arm 206e and a second arm 206f, and the connection end 206c is located at the end of the first arm 206e. One end of the second arm 206f is connected to the first arm 206e, and the free end 206d is located at the other end of the second arm 206f. In the present embodiment, the free end 206d is connected to the first probe 200 or the second probe 201 via the probe connecting seat 207. In the present embodiment, the probe connecting seat 207 is detachably connected to the second arm 206f. The first probe 200 or the second probe 201 is arranged on the probe connecting seat 207. The signal transmission interface 206h of the probe is electrically connected to the coaxial connector 204 through the signal cable 206i. The pressure sensor 206b is arranged on the surface of the first arm 206e and is electrically connected to the pressure sensor connector 208 whereby the pressure sensor 206b can transmit sensing signals to the test machine 2 through the pressure sensor connector 208.

Figure 1D:
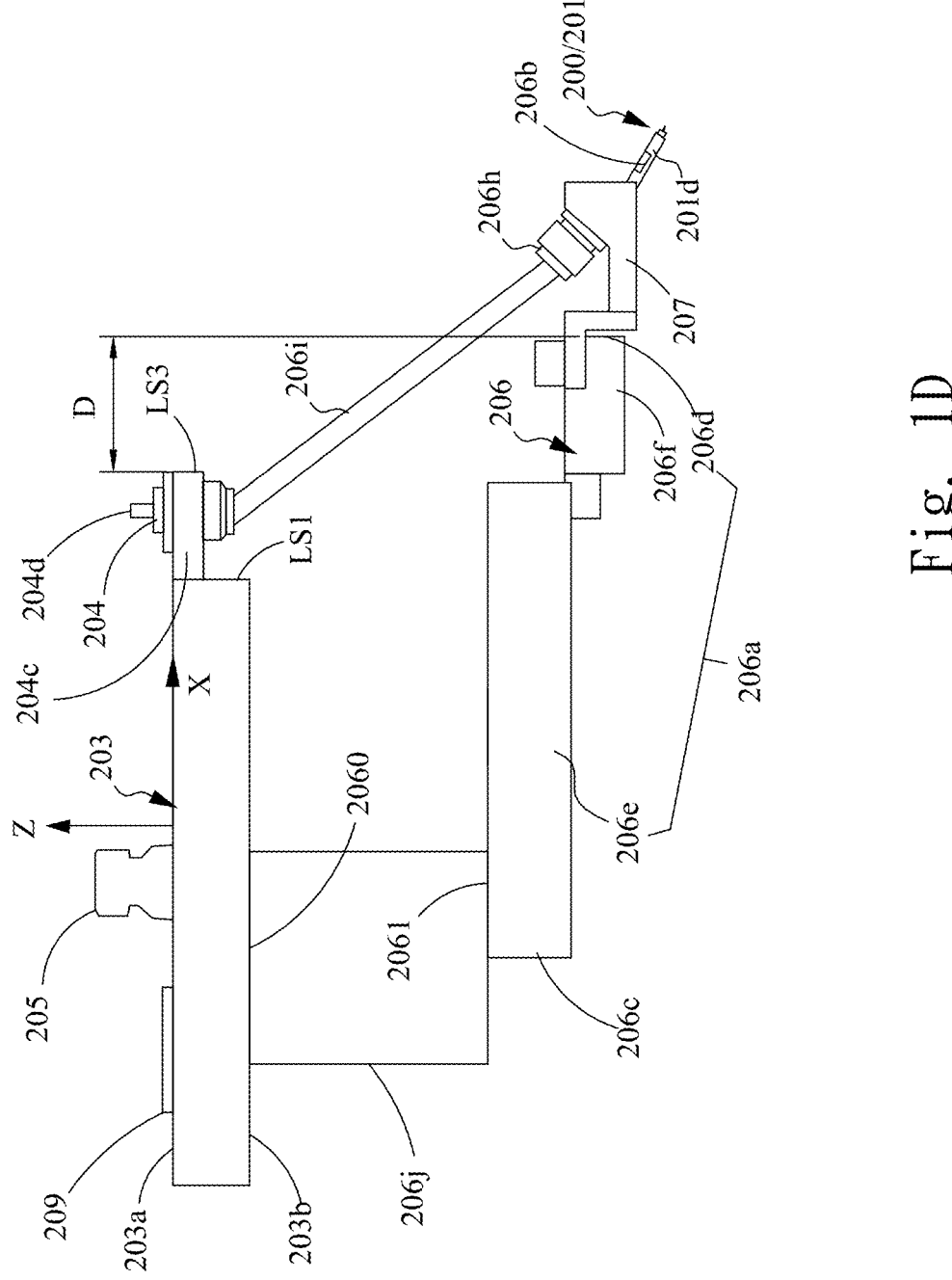
FIG. 1D to FIG. 1E schematically illustrates different embodiments of the pressure sensor of the present invention.
Figure 1E:
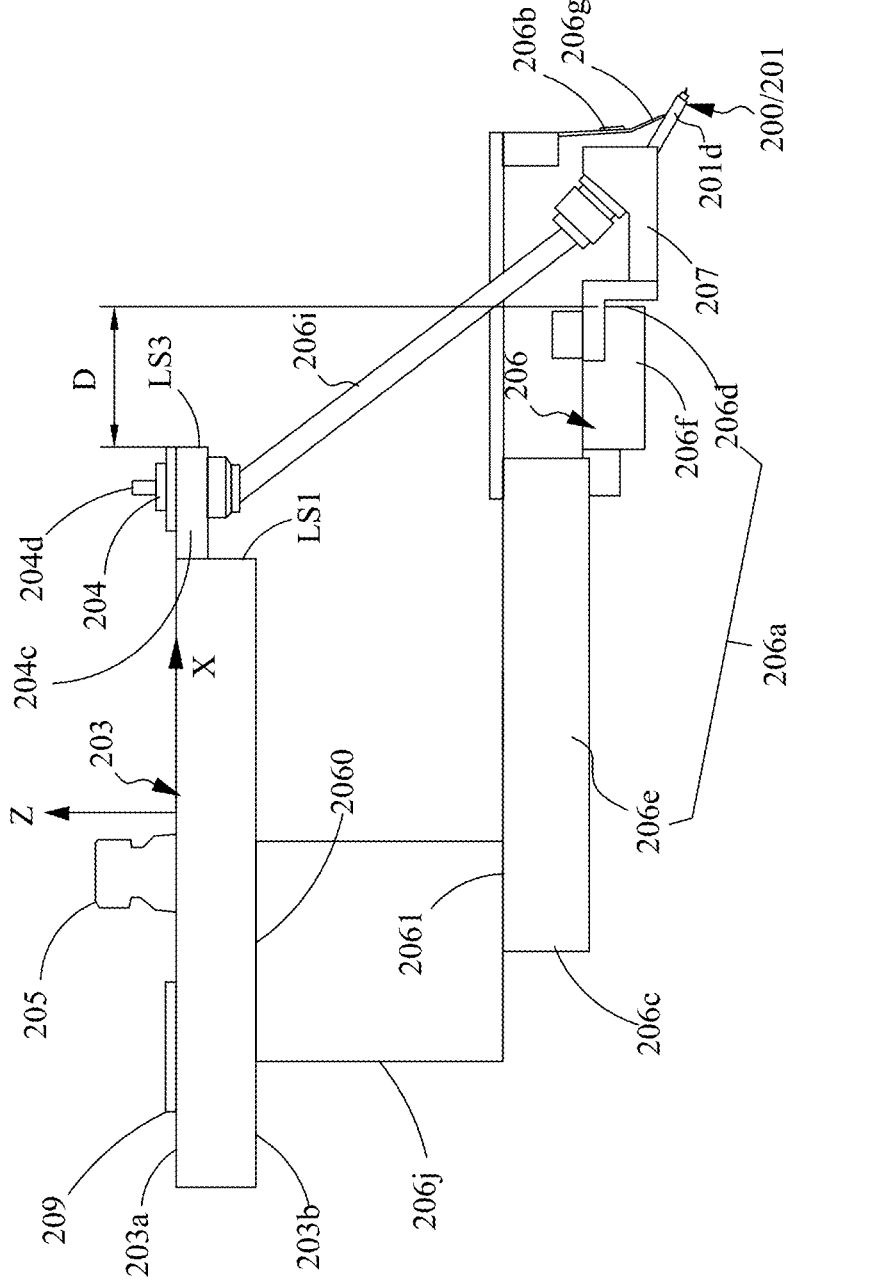

It should be noted that the location where the pressure sensor 206b is arranged is not limited to location shown in FIG. 1B. For example, in one embodiment, as shown in FIG. 1D, the pressure sensor 206b is directly placed on the impedance matching structure 201d of the first probe 200 or the second probe 201. In the present embodiment, the impedance matching structure 201d is a copper tube with a coaxial structure. The approach shown in the present embodiment can directly obtain the signal of pressure variation generated by the first probe 200 or the second probe 201 when contacting the DUT, thereby improving measurement accuracy. In another embodiment, as shown in FIG. 1E, an elastic extension element 206g can be arranged to touch the first probe 200 or the second probe 201. For example, the elastic extension element 206g can be arranged to touch or have one end fixed to the impedance matching structure 201d of the first probe 200 or the second probe 201. The pressure sensor 206b is directly arranged on the elastic extension element 206g. Therefore, when the first probe 200 or the second probe 201 is bent due to the pressure generated by contacting the DUT, the elastic extension element 206g contacting the first probe 200 or second probe 201 is also deformed due to the exerted pressure, whereby the pressure sensor 206b generates a sensing signal due to the deformation of the elastic extension element 206g.

In one embodiment, it further comprises a spacer block 206j comprising a first end face 2060 and a second end face 2061, where the first end face 2060 is connected to the second surface 203b of the base 203, and the second end face 2061 is connected to the connection end 206c of the cantilever 206a. Since the signal cable 206i has a certain rigidity, it is not suitable for excessive bending. Accordingly, through the design of the spacer block 206j, the accommodation area of the signal cable 206i is expanded, thereby preventing excessive bending of the signal cable 206i. In one embodiment, both the coaxial connector 204 and the pressure sensor connector 205 are connected on the same side of the base 203.

The base 203 has a first side LS1 along the first axis X. At the direction along the third axis toward the quick coupling probe head, the coaxial connector 204 is arranged between the mechanical connector 205 and the free end 206d and is coupled to the first side LS1 of the base 203. The cantilever 206a protrudes from the connection end 206c to the free end 206d along the first axis X, and protrudes away from first side LS1 of the base 203. In one embodiment, the coaxial connector 204 is coupled to the base 203 through an extension plate 204c. The extension plate 204c has a first side LS3 along the first axis X. The coaxial connector 204 is arranged between the first side LS1 of the base 203 and the first side LS3 of the extension plate 204c. The first side LS3 of the extension plate 204c has a specific distance D away from the free end 206d along the first axis X. Furthermore, along the third axis toward the quick coupling probe head, the first side LS3 of the extension plate 204c has a specific distance D away from the free end 206d along the first axis X. If the signal cable 206i between the first probe 200 or the second probe 201 on the probe head 20a/20b and the coaxial connector 204 is too long, it can adversely affect the transmission of high-frequency test signals. Accordingly, how to shorten the length of the signal cable 206i to reduce signal loss is also a design challenge to overcome. Therefore, in this embodiment, the coaxial connector 204 is connected to the first side LS1 of the base 203, and the free end 206d of the cantilever 206a protrudes from the first side LS1, and has a specific distance D away from the coaxial connector 204 along the protruding direction (first axis X). Through the design of the aforementioned embodiment, the free end 206d of the cantilever 206a and the coaxial connector 204 are located on the same side so as to shorten the distance between the first probe 200 or the second probe 201 and the coaxial connector 204 such that length of the signal cable 206i is reduced thereby achieving to effect of reducing the signal loss. Additionally, with the design of the specific distance, the free end 206d of the cantilever 206a is not obstructed by the coaxial connector 204 or the base 203. For example, in the present embodiment, the first probe 200 or the second probe 201 on one side of the free end 206d is outside the first side LS1 of the base 203. Therefore, the image capture device of the visual recognition module 22 on the test machine 2 can capture images of the first probe 200 or the second probe 201 without obstruction, thereby accurately judging the needle tips of the high-frequency probe.

Figure 1F:
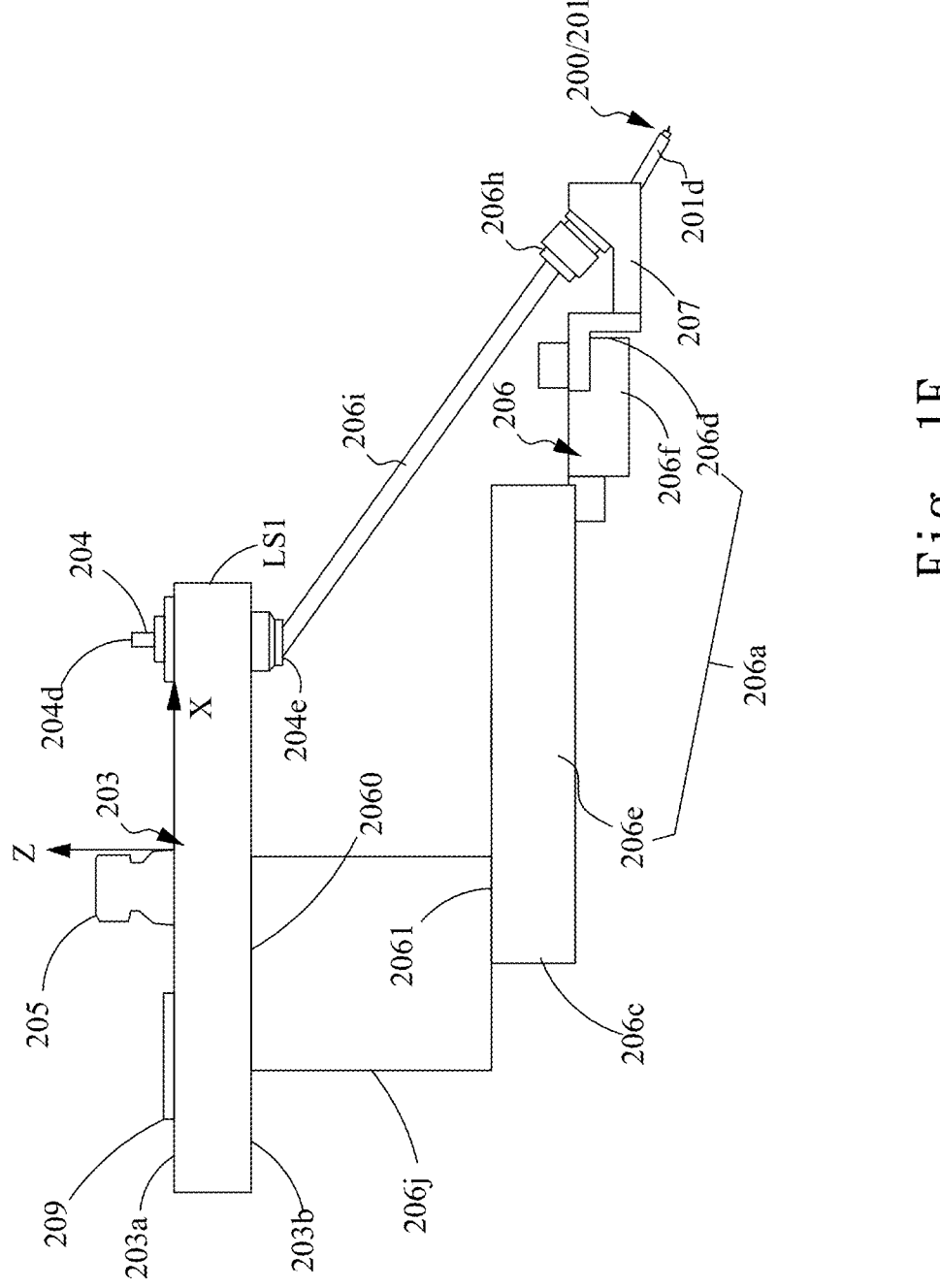
FIG. 1F is a schematically illustrates another embodiment of the coaxial connector of the present invention.

It is noted that there are a plurality of ways to arrange the coaxial connector 204 on the base 203. For example, in the aforementioned embodiment, the base 203 has an extension plate 204 on the first side LS1. The coaxial connector 204 is arranged on the extension plate 204c. The first end 204d of the coaxial connector 204 protrudes above the top surface of the extension plate 204c, while the second end 204e passes through the bottom surface of the extension plate 204c (as shown in FIG. 1C), so that the coaxial connector 204 is indirectly connected to the base 203. In this way, the coaxial connector 204 penetrates through the top and bottom surfaces of the extension plate 204c so as to provide space below the bottom surface of the extension plate 204c for the signal cable 206i to connect electrically with the coaxial connector 204 without interference. In another embodiment, as shown in FIG. 1F, the coaxial connector 204 can also be directly arranged on the base 203. The first end 204d extends vertically upward to a specific height from the first surface 203a, while the second end 204e extends downward from the second surface 203b and then connects electrically with the signal cable 206i.

Figure 2:
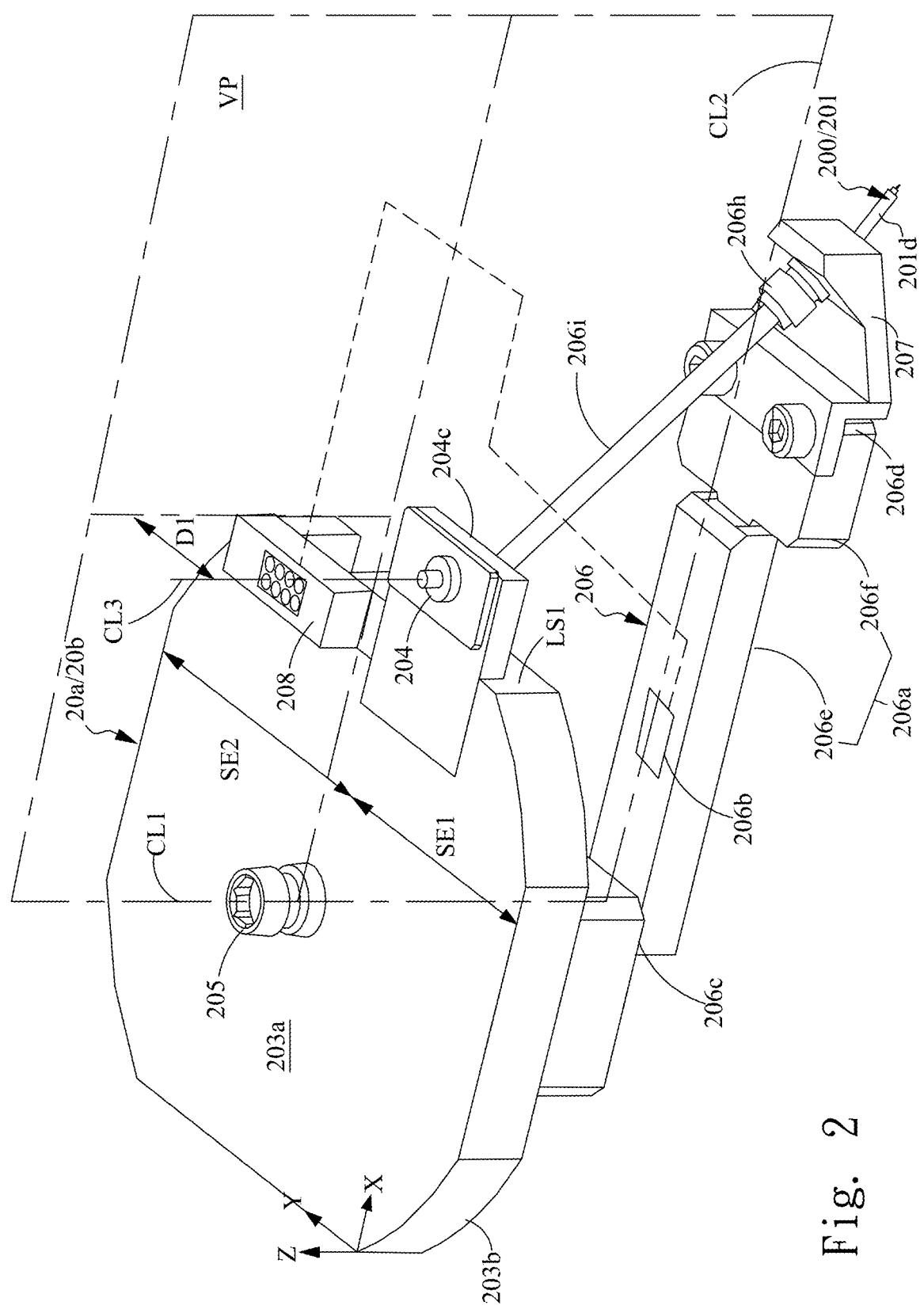
FIG. 2 schematically illustrates a perspective view of an embodiment of the quick coupling probe head of the present invention.

As shown in FIG. 2, the first surface 203a is located on the first axis X and the second axis Y perpendicular to the first axis. The first axis X and the second axis Y are perpendicular to the third axis Z. The base 203 has a first side LS1 along the first axis X. At the direction along the third axis toward the quick coupling probe head, the coaxial connector 204 is positioned between the mechanical connector 205 and the free end 206d. The axial centerline CL1 of the mechanical connector 205 and the centerline CL2 of the longitudinal axis of the cantilever 206 constitute a virtual plane VP perpendicular to the first surface 203a and passing through the cantilever 206, thereby dividing the first side LS1 of the base 203 into a first segment SE1 and a second segment SE2. The coaxial connector 204 couples to the first segment SE1 of the first side LS1 of the base 203. In this embodiment, the part of first side LS1 of the base 203 located at the first segment SE1 is partially connected to the extension plate 204c. The coaxial connector 204 is arranged on the extension plate 204c. The first end 204d of the coaxial connector 204 located on the first surface 203a and the second end 204e of the coaxial connector 204 penetrating through the extension plate 204c. The axial centerline CL3 of the coaxial connector 204 has a distance D1 away from the virtual plane VP, i.e., the distance D1 in the second axial direction Y in the present embodiment. The pressure sensor connector 208 is arranged on the second segment SE2 of the base 203. Because the signal cables have a certain rigidity, it should not be excessively bent. In addition, due to the rigidity of the signal cables, if the position of the coaxial connector 204 is arranged improperly, the signal cable 206i will easily exert preload on the cantilever 206a, thereby affecting the measurement value of the pressure sensor 206b. Therefore, through the design of this embodiment, the coaxial connector 204 and the mechanical connector 205 are designed to have offset, i.e. the distance D1 in this embodiment. Furthermore, from the view angle along the first axial direction towards the quick coupling probe head, an offset is designed between the coaxial connector 204 and the mechanical connector 205. This design not only reduces the bending of the signal cables and prevents cable breakage, thereby maintaining signal transmission stability, but also avoids the issue of preload exerted on the cantilever 206a, so as to ensure the sensing accuracy of the pressure sensor 206b on the cantilever 206a. Additionally, the coaxial connector 204 and the pressure sensor connector 208 arranged on the same side LS1 can simplify the circuit design thereby making the circuit layout easier. In addition to the aforementioned offset design between the coaxial connector 204 and the mechanical connector 205, it is also possible to change the position or change the arranging way of the pressure sensor 206b, such as embodiment shown in FIG. 1C or FIG. 1D, to directly measure the stress on the probe, thereby maintaining the accuracy of the pressure sensor 206b. In other embodiments, the coaxial connector 204 and the pressure sensor connector 208 can also be arranged on different sides.

As shown in FIG. 2, the first surface 203a of the base 203 is located on the first axis X and the second axis Y that are mutually perpendicular to each other. The base 203 has a first side LS1 along the first axis X. At the direction along the third axis toward the quick coupling probe head, the coaxial connector 204 is positioned between the mechanical connector 205 and the free end 206d. From the first axis X towards the quick coupling probe head, the mechanical connector 205 extending along the first axis to the first side LS1 of the base 203 can divide the first side LS1 into the first segment SE1 and the second segment SE2. The coaxial connector 204 is coupled to the first segment SE1 of the first side LS1 of the base 203.

Figure 3A:
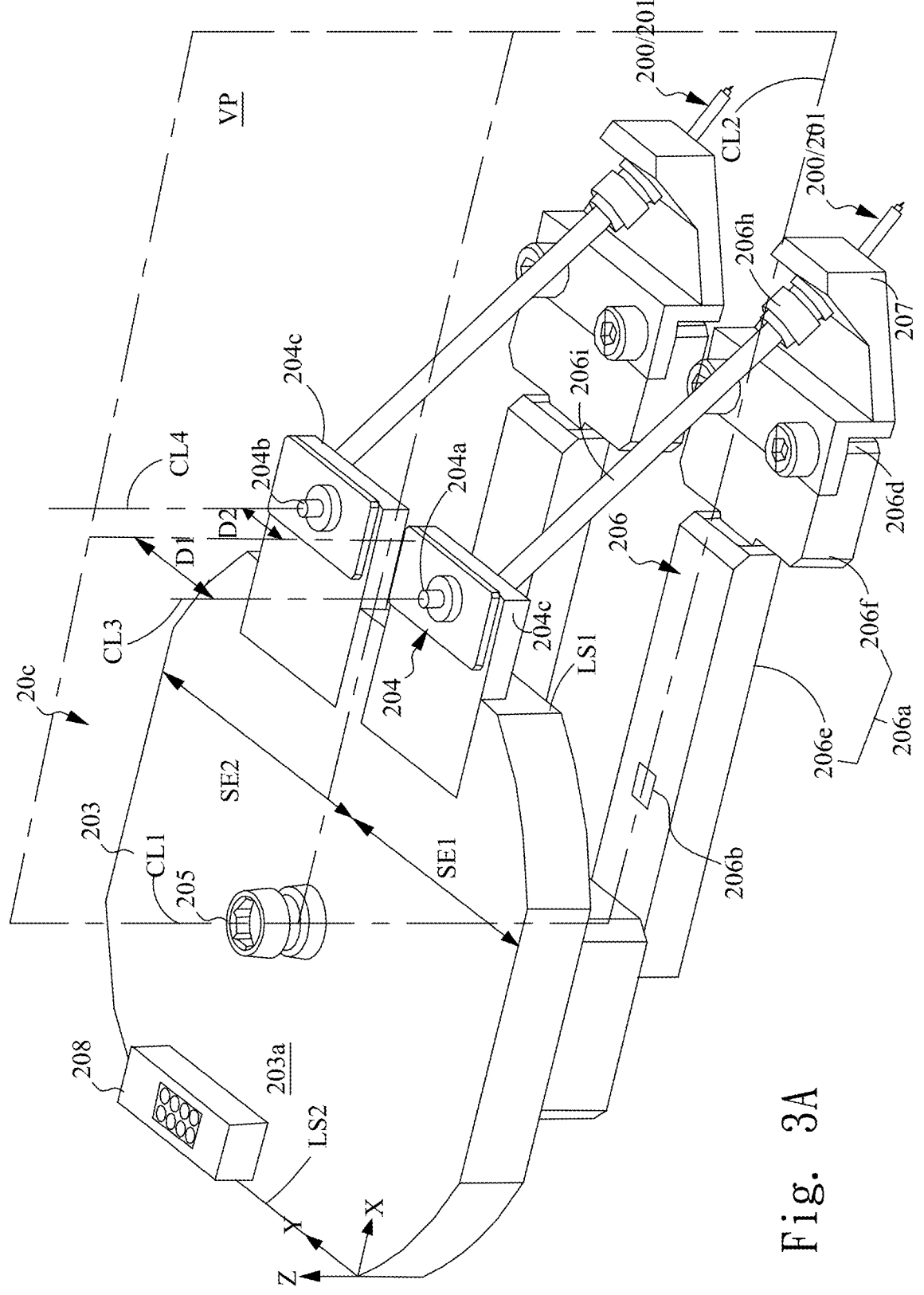
FIG. 3A schematically illustrates a perspective view of another embodiment of the quick coupling probe head of the present invention.

As shown in FIG. 3A, which schematically illustrates another embodiment of the probe head of the present invention. In this embodiment, the coaxial connector 204 further comprises a first coaxial connector 204a and a second coaxial connector 204b. From the axial direction along first axis X towards the quick coupling probe head, a part of first side LS1 of the base 203 at the first segment SE1 is connected to an extension plate 204c and a part of first side LS1 of the base 203 at the second segment SE2 is connected to another extension plate 204c. The first coaxial connector 204a and the second coaxial connector 204b are respectively arranged on the first segment SE1 and the second segment SE2 of the extension plates 204c. The arrangement of the first coaxial connector 204a and the second coaxial connector 204b is the same as previously described way, and will not be described hereinafter. The first coaxial connector 204a is arranged on the first segment SE1 to transmit the test signals from the probe coupled therewith, such as GS. The second coaxial connector 204b is arranged on the second segment SE2 to transmit the test signals from the probe coupled therewith, such as SG. The base 203 also has a second side LS2 that is parallel and opposite to the first side LS1. The mechanical connector 205 is arranged between the first side LS1 and the second side LS2, and is located at or approximately at the center of the base 203. The first coaxial connector 204a and the second coaxial connector 204b are arranged on the first side LS1, while the pressure sensor connector 208 is arranged on the second side LS2. In this embodiment, the axial centerline CL3 along the axial direction of the first coaxial connector 204a has a distance D1 away from the virtual plane VP, and the axial centerline CL4 along the axial direction of the second coaxial connector 204b has a distance D2 away from the virtual plane VP. It should be noted that although the first side LS1 is parallel to the second side LS2 in the aforementioned embodiment, it is not limited to this configuration; for example, the second side can also be adjacent to the first side. Through the offset design between the first and second coaxial connectors 204a and 204b and the mechanical connector 205, i.e., a distance of D1 and D2 along the Y-axis in the present embodiment, the bending of the signal cables can be reduced so as to prevent cable breakage and maintain the stability of signal transmission. Furthermore, due to the rigidity of signal cable 206i, if the position of the coaxial connector 204 is improper arranged, it can easily induce the signal cable 206i exerting preload on cantilever 206a so as to affect the measurement of pressure sensor 206b. Therefore, through the aforementioned offset design, it can prevent the accuracy of pressure sensor 206b on cantilever 206a from being affected. Additionally, in some certain utilization scenarios, the first and second coaxial connectors 204a and 204b can be utilized to generate differential measurement signals so as to avoid signal interference and enhance accuracy of measurement signal.

In other embodiments, the first and second coaxial connectors 204a and 204b can also be coupled to the two second sides of the mechanical connector 205. The two second sides here are referred to the two second sides adjacent to the first side LS1.

Figure 3B:
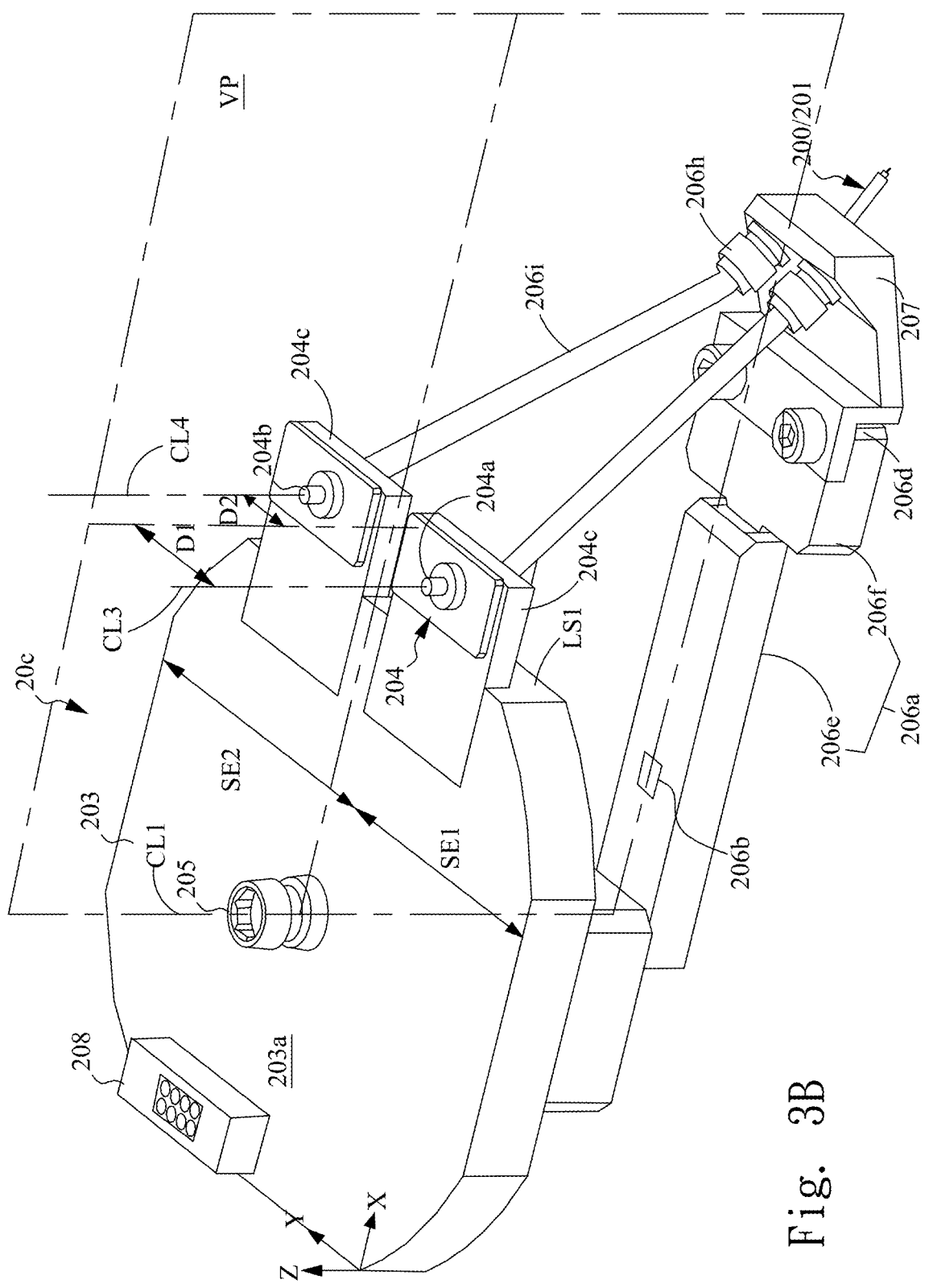
FIG. 3B schematically illustrates a perspective view of another embodiment of the quick coupling probe head of the present invention.
Figure 3C:
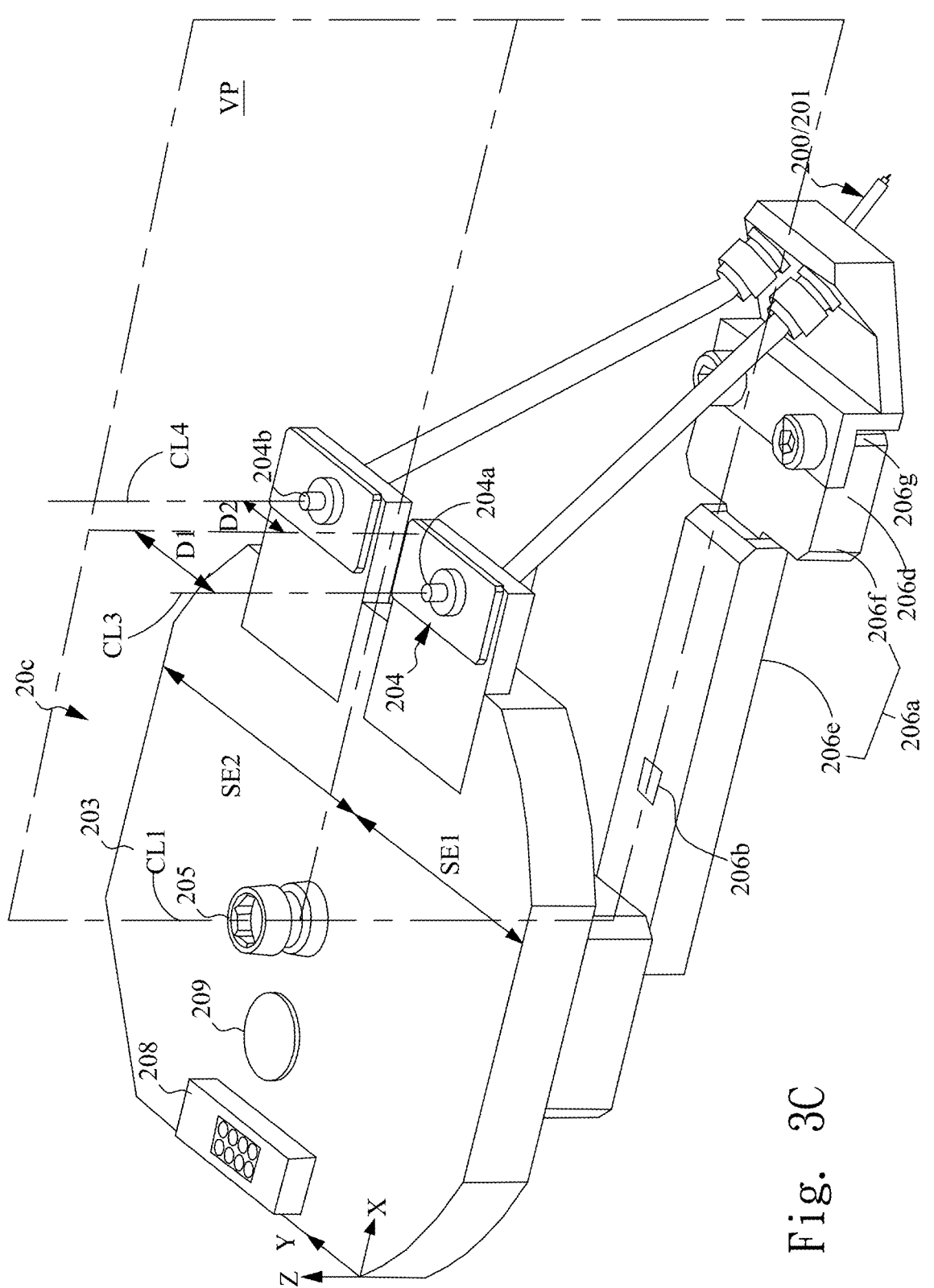
FIG. 3C schematically illustrates a perspective view of another embodiment of the quick coupling probe head of the present invention.

In addition to the embodiment shown in FIG. 3A, in another embodiment, as shown in FIG. 3B, the design of the base 203 is essentially similar to that shown in FIG. 3A, wherein the difference part is that the probe connecting seat 207 has two signal transmission interfaces 206h, and the high-frequency probes 200/201 on the probe connecting seat 207 are in a GSSG configuration in this embodiment. The two signal transmission interfaces 206h in the FIG. 3B are respectively coupled with the signal cable 206i and the first coaxial connector 204a and second coaxial connector 204b on the base 203. The first and second coaxial connectors 204a and 204b can generate differential signals, which can avoid signal interference and enhance accuracy of measurement signal. As shown in FIG. 3C, in this embodiment, it is basically similar to the previous embodiments shown in FIG. 3A or 3B. The difference is that an alignment mechanism 209 is arranged on the first surface 203a of the base 203 and is arranged between the pressure sensor connector 208 and the mechanical connector 205. The function and purpose are the same as previously described embodiment shown in FIG. 1B, and will not be described hereinafter.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A quick coupling probe head for testing a circuit board, comprising:
   a base, comprising a first surface and a second surface corresponding to the first surface;
   a coaxial connector, coupled with the base and utilized to couple with a probe head connection part of a test machine for transmitting high-frequency signals, wherein one end of the coaxial connector is higher than the first surface;
   a mechanical connector, arranged on the first surface for connecting to the probe head connection part of the test machine, wherein the mechanical connector is closer to the center of the base compared to the coaxial connector; and
   a probe holding part, connected to the second surface, wherein one end of the probe holding part is utilized to connect to a high-frequency probe electrically connected to the coaxial connector.

2. The probe head of claim 1, wherein a height of the mechanical connector is greater than a height of the coaxial connector.

3. The probe head of claim 1, wherein the first surface is located on a first axis and a second axis that are perpendicular to each other, the mechanical connector and the coaxial connector respectively extend a specific height along a third axis that is perpendicular to the first and second axes, the mechanical connector and the coaxial connector respectively comprise an opening with a normal vector parallel to the third axis, and an alignment mechanism is further arranged on the first surface, wherein a distance between the alignment mechanism and the mechanical connector is less than a distance between the alignment mechanism and the coaxial connector.

4. The probe head of claim 1, wherein the first surface further comprises a pressure sensor connector, and the probe holding part further comprises:

a cantilever, coupled to the base, comprising a connecting end and a free end, wherein the connecting end is coupled to the base, and the free end is utilized to connect to the high-frequency probe; and a pressure sensor, arranged on a surface of the cantilever and is coupled to the pressure sensor connector.

5. The probe head of claim 4, wherein the first surface is located along a first axis and a second axis that are perpendicular to each other, the first and second axes are perpendicular to a third axis, and the base comprises a first side extending along the first axis, wherein at the direction along the third axis toward the quick coupling probe head, the coaxial connector is positioned between the mechanical connector and the free end, the coaxial connector is coupled to the first side of the base, and the cantilever extends along the first axis from the connecting end to the free end, and protrudes away from the first side of the base.

6. The probe head of claim 4, wherein the first surface is located along a first axis and second axis that are perpendicular to each other, the first and second axes is perpendicular to a third axis, and the base comprises a first side extending along the first axis, wherein at the direction along the third axis toward the quick coupling probe head, the first side of the base is positioned between the mechanical connector and the free end, the coaxial connector is positioned on an extension plate positioned on the first side of the base, the cantilever extends along the first axis from the connecting end to the free end, the extension plate has a first side along the first axis, and the coaxial connector is positioned between the first side of the base and the first side of the extension plate, and a distance is defined between the first side of the extension plate and the free end along the first axis.

7. The probe head of the claim 4, wherein the first surface is located on a first axis and a second axis that are perpendicular to each other, the first and second axes are perpendicular to a third axis, and the base comprises a first side extending along the first axis, wherein at the direction along the third axis toward the quick coupling probe head, the coaxial connector is positioned between the mechanical connector and the free end, a virtual plane is formed by the central axis of the mechanical connector along an axial direction of the mechanical connector and the central axis of the cantilever along an extension direction, the virtual plane is perpendicular to the first surface and passes through the cantilever thereby dividing the first side of the base into first and second segments, the coaxial connector couples to the first segment of the first side of the base, and the central axis of the coaxial connector in an axial direction of the coaxial connector has a distance spaced from the virtual plane along the second axis.

8. The probe head of claim 7, wherein the pressure sensor connector is arranged on the second segment of the base.

9. The probe head of claim 4, wherein the first surface is located on a first axis and a second axis that are perpendicular to each other and are perpendicular to a third axis, and the base further comprises a first side along the first axis, wherein, at the direction along the third axis toward the quick coupling probe head, a virtual plane is formed by the central axis of the mechanical connector along an axial direction of the mechanical connector and the central axis of the cantilever along an extension direction, the virtual plane is perpendicular to the first surface and passes through the cantilever thereby dividing the first side of the base into first and second segments, and the coaxial connector further comprises a first coaxial connector and a second coaxial connector coupled to the first segment and the second segment of the first side of the base, respectively.

10. The probe head of claim 9, wherein the base further comprises a second side parallel to or adjacent to the first side, the mechanical connector is arranged between the first side and the second side, the first coaxial connector and the second coaxial connector are arranged on the first side, and the pressure sensor connector is arranged on the second side.

11. The probe head of claim 4, further comprising a spacer block having a first end surface and a second end surface, wherein the first end surface is connected to the second surface of the base, and the second end surface is connected to the connecting end of the cantilever.

12. The probe head of claim 4, wherein the coaxial connector and the pressure sensor connector are both arranged on the same side of the base.

13. The probe head of claim 1, wherein the coaxial connector is a plug connector.

* * * * *